(12) United States Patent
Jasper

(10) Patent No.: US 8,080,859 B2
(45) Date of Patent: Dec. 20, 2011

(54) REDUCING STRESS BETWEEN A SUBSTRATE AND A PROJECTING ELECTRODE ON THE SUBSTRATE

(75) Inventor: Joerg Jasper, Hamburg (DE); Ute Jasper, legal representative, Tschugg (CH)

(73) Assignee: NXP B.V., Eindhoven (NL)

( * ) Notice: Subject to any disclaimer, the term of this patent is extended or adjusted under 35 U.S.C. 154(b) by 384 days.

(21) Appl. No.: 12/377,723

(22) PCT Filed: Aug. 13, 2007

(86) PCT No.: PCT/IB2007/053207
§ 371 (c)(1),
(2), (4) Date: Mar. 19, 2009

(87) PCT Pub. No.: WO2008/020391
PCT Pub. Date: Feb. 21, 2008

(65) Prior Publication Data
US 2010/0230808 A1 Sep. 16, 2010

(30) Foreign Application Priority Data
Aug. 17, 2006 (EP) .................................. 06119078

(51) Int. Cl.
*H01L 21/70* (2006.01)
(52) U.S. Cl. ........ 257/522; 257/784; 257/758; 257/776; 438/612; 438/617; 438/611; 438/461
(58) Field of Classification Search .................. 257/522, 257/758, 776, 784; 438/612, 717, 611, 461
See application file for complete search history.

(56) References Cited

U.S. PATENT DOCUMENTS

| | | | |
|---|---|---|---|
| 4,937,653 A | 6/1990 | Blonder et al. | |
| 5,545,489 A | 8/1996 | Tanaka et al. | |
| 6,028,364 A * | 2/2000 | Ogino et al. | 257/778 |
| 6,088,236 A | 7/2000 | Tomura et al. | |
| 6,204,089 B1 | 3/2001 | Wang | |
| 6,221,750 B1 | 4/2001 | Fjelstad | |
| 6,521,970 B1 | 2/2003 | Takiar | |
| 6,806,570 B1 | 10/2004 | Lee et al. | |
| 6,881,609 B2 | 4/2005 | Salmon | |
| 2005/0020052 A1* | 1/2005 | Lee et al. | 438/613 |
| 2005/0104226 A1 | 5/2005 | Chang et al. | |
| 2005/0230846 A1* | 10/2005 | Chang et al. | 257/780 |

FOREIGN PATENT DOCUMENTS
WO 0209484 A 1/2002

* cited by examiner

*Primary Examiner* — Kiesha Bryant
*Assistant Examiner* — Telly Green

(57) ABSTRACT

The present invention relates to a semiconductor component that has a substrate and a projecting electrode. The projecting electrode has a substrate face, which faces the substrate and which comprises a first substrate-face section separated from the substrate by a gap. The gap allows a stress-compensating deformation of the projecting electrode relative to the substrate. The substrate face of the projecting electrode further comprises a second substrate-face section, which is in fixed mechanical and electrical connection with the substrate. Due to a smaller footprint of mechanical connection between the projecting electrode and the substrate, the projecting electrode can comply in three dimensions to mechanical stress exerted, without passing the same amount of stress on to the substrate, or to an external substrate in an assembly. This results in an improved lifetime of an assembly, in which the semiconductor component is connected to an external substrate by the projecting electrode.

9 Claims, 3 Drawing Sheets

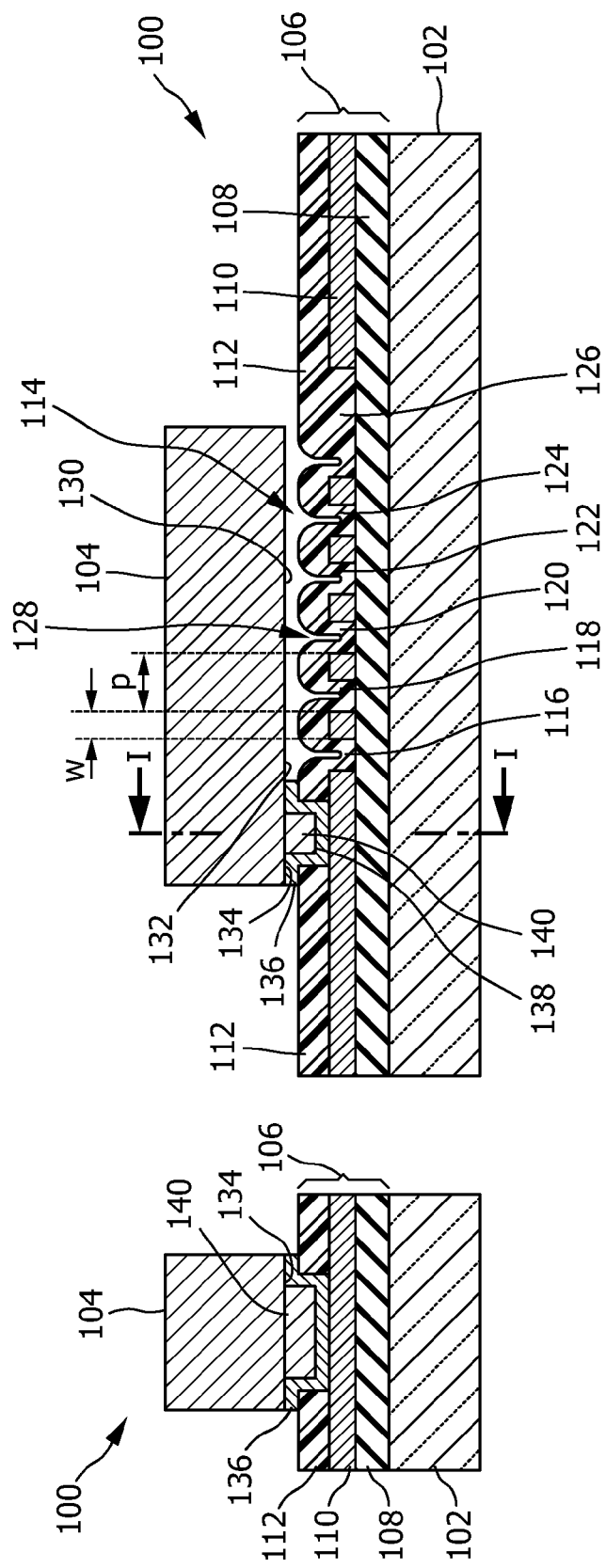

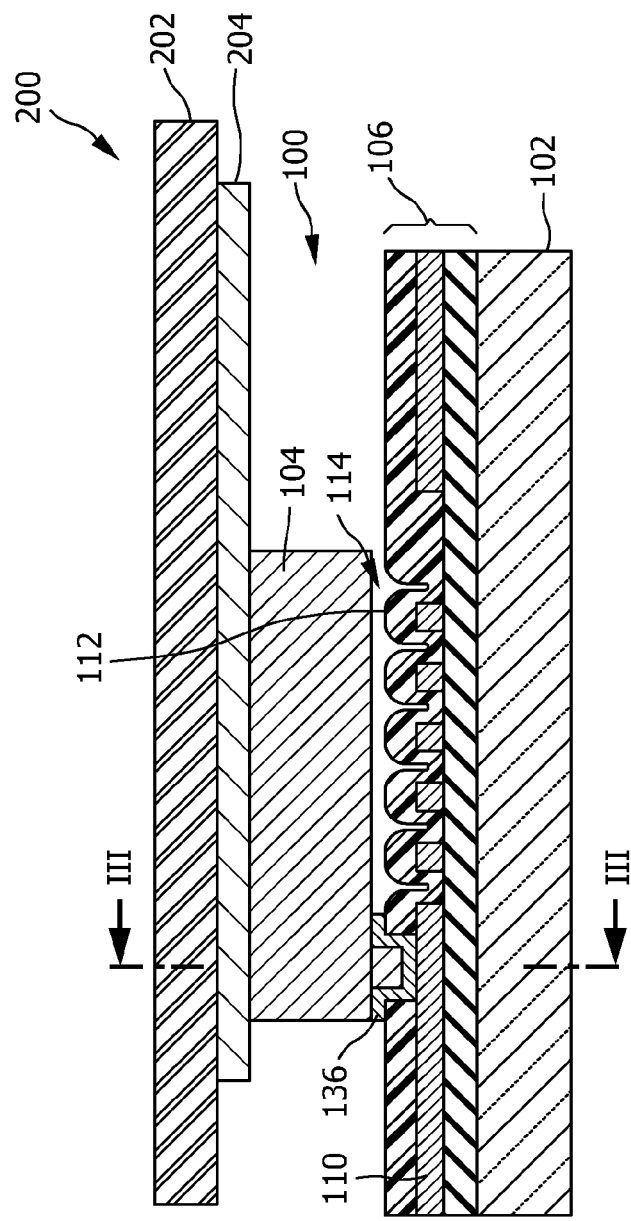
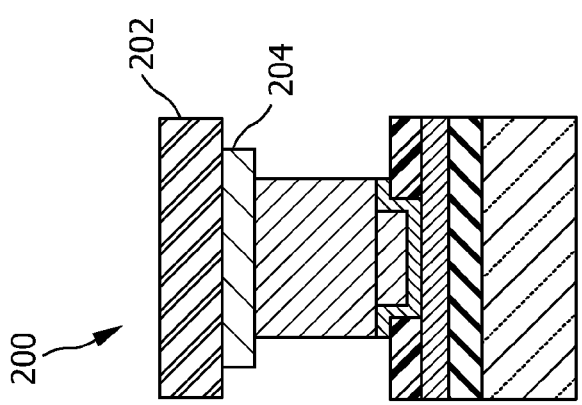

REDUCING STRESS BETWEEN A SUBSTRATE AND A PROJECTING ELECTRODE ON THE SUBSTRATE

FIELD OF THE INVENTION

The present invention relates to a semiconductor component having a substrate and a projecting electrode on the substrate for electrically connecting the semiconductor component to an external substrate. The present invention further relates to a component-external-substrate assembly, comprising a semiconductor component and an external substrate, to a method for fabricating a semiconductor component, and to a method for fabricating a component-external-substrate assembly.

BACKGROUND OF THE INVENTION

For mounting a semiconductor component, such as a chip comprising integrated circuitry, on an external substrate, such as a circuit board, it is a well-known technique to bond the semiconductor component to the external substrate by means of projecting electrodes on an internal substrate of the semiconductor component. The projecting electrodes often take the form of bumps. Note that the internal substrate of the semiconductor component will hereinafter be referred to in short as "substrate" while the external substrate will always be referred to as the "external substrate" without abbreviation.

U.S. Pat. No. 5,545,589 addresses the problem of mechanical stress between a bump and the substrate of the semiconductor component, on which the projecting electrode is arranged. In order to avoid cracking, a bump front end facing the substrate is provided with a rugged surface before fixing it to the substrate by means of a conductive adhesive. This way, a contact surface area is increased, which in turn shall increase the adhesion strength for improving the reliability of the electrical and mechanical connection. However, a stronger mechanical connection between the bump and the substrate only increases the threshold of mechanical stress that is tolerable.

SUMMARY OF THE INVENTION

According to a first aspect of the invention, a semiconductor component is provided that has a substrate and a projecting electrode on the substrate. The projecting electrode is suitable for electrically connecting the semiconductor component to an external substrate. It has a substrate face, which faces the substrate and which comprises a first substrate-face section separated from the substrate by a gap. The gap allows a stress-compensating deformation of the projecting electrode relative to the substrate. The substrate face of the projecting electrode further comprises a second substrate-face section, which is in fixed mechanical connection and in electrical connection with the substrate.

The semiconductor component of the first aspect of the invention reduces the stress exerted from the projecting electrode to the substrate by means of a reduced contact area of mechanical connection between the projecting electrode and the substrate in the second substrate-face section, in comparison with the full area of the substrate face of the projecting electrode. If mechanical stress is exerted, the projecting electrode has the ability to comply to the stress by a deformation of the projecting electrode relative to the substrate in three dimensions. The gap that separates the projecting electrode from the substrate in the first substrate-face section of the substrate face of the projecting electrode reduces the coupling between the projecting electrode and the substrate and enables the deformation of the projecting electrode.

Mechanical stress between a projecting electrode and the substrate or, in a component-external-substrate assembly, also between the projecting electrode and the external substrate can for instance be caused by differences between the coefficients of thermal expansion of the component and of the external substrate. For the component is typically based on silicon and further comprises layers of metal and layers made of insulators, while the external substrate is often made of an organic material, exhibiting a different behavior during temperature changes. Such mechanical stress due to a difference in thermal expansion coefficients can produce a crack of an isolation layer on the substrate of the semiconductor component, a delamination of layers, or even a breakout of silicon. On the side of the circuit board, a delamination of films arranged on the circuit board has been observed due to exerted mechanical stress.

Therefore, due to a smaller footprint of mechanical connection between the projecting electrode and the substrate, the projecting electrode of the semiconductor component of the first aspect of the invention can comply in three dimensions to mechanical stress exerted, without passing the same amount of stress on to the substrate, or to an external substrate. Instead of increasing the mechanical strength of the connection between the bump and the substrate, as suggested by U.S. Pat. No. 5,545,589, an increased ability to comply with the mechanical stress is provided with the semiconductor component of the first aspect of the invention. This also results in an improved lifetime of an assembly, in which the substrate of the semiconductor component is connected to an external substrate by the projecting electrode.

The invention has a wide range of application. It can be used for an assembly of a semiconductor component and an external substrate, for discrete components based on Si, GaAs, SiGe or other technology, for optical components, for mechanical assemblies, for MEMS, and any other assembly that makes use of a rigid projecting-electrode structure.

According to a second aspect of the invention, a component-external-substrate assembly is provided that comprises the semiconductor component of the first aspect of the invention, which is connected to an external substrate through the projecting electrode. The component-external-substrate assembly shares the advantages of the semiconductor component of the first aspect of the invention.

In the following, preferred embodiments of the semiconductor component of the first aspect of the invention as well as preferred embodiments of the component-external-substrate assembly will be described. It is understood that preferred embodiments of the semiconductor component also form preferred embodiments of the component-substrate assembly, which comprises the semiconductor component of the first aspect of the invention. Furthermore, the embodiments described herein can be combined with each other unless explicitly described as alternative embodiments.

The footprint of mechanical connection between the projecting electrode and the substrate can be minimized to the amount required for providing an adhesive force between the substrate and the projecting electrode that is required under operating conditions. In a first embodiment, therefore, the amount of area taken by the second substrate-face section in relation to the first substrate-face section corresponds to a required minimum adhesive force between the substrate and the projecting electrode. In this embodiment, the area fraction of the first substrate-face section is maximized, thus allowing the best possible compliance of the projecting electrode to exerted mechanical stress by a stress-induced deformation.

The gap between the substrate and the first substrate-face section of the projecting electrode can be filled with any medium that allows a stress-induced deformation of the projecting electrode relative to the substrate. While a gaseous medium is preferred, it is also possible to fill the gap with a liquid medium or an emulsion in order to improve the thermal contact between the substrate and the projecting electrode.

Preferably, the substrate face of the projecting electrode is flat. This provides a particularly simple geometrical structure of the projecting electrode, which is easy to fabricate.

In an alternative embodiment, the substrate face of the projecting electrode has a recess structure that forms the gap between the first substrate-face section and the substrate.

Preferably, however, the gap between the first substrate-face section and the substrate comprises a recess structure, which is associated with the substrate. This embodiment provides a gap that can be fabricated by rather simple processing techniques during the fabrication of the substrate, and a later under-etching of the projecting electrode in the range of the first substrate-face section, as will be explained in further detail in the context of preferred embodiments of the method of the invention.

In the embodiment just described, the recess structure preferably comprises different surface portions facing the projecting electrode, which are arranged at different distances from the bottom face of the projecting electrode in its first substrate-face section. This recess structure can for instance comprise a plurality of adjacent channel-like structures, which promote the distribution of a liquid etchant in the under-etching step by capillary effects.

Furthermore, the recess structure is preferably formed in a layer stack, which is arranged on the substrate. The layer stack can for instance include a metallization layer and a passivation layer deposited on the metallization layer. In such a layer structure, the projecting electrode, in its second substrate section, is connected with the metallization layer for establishing electrical contact with the substrate. The passivation layer is preferably performed by an electrically insulating material, such as silicon dioxide $SiO_2$ or a silicon oxynitride.

In one embodiment recess structures are provided on the substrate side as well as on the substrate face of the projecting electrode.

The mechanical adhesion between the projecting electrode and the substrate in the second substrate-face section is preferably increased by an electrically conductive adhesion layer. The adhesion layer can for instance be deposited on the metallization layer in the layer structure described above. However, the adhesion layer does not extend into the first substrate-face section in order to provide the deformability of the projecting electrode.

The projecting electrode preferably forms a bump, as is in wide use in prior-art technology. Preferred materials suitable for forming the projecting electrode are gold Au and copper Cu. Other examples are aluminum Al, silver Ag, platinum Pt, or nickel Ni. Generally, any conducting layer that can be manufactured to the required height and shape and could be connected to the external substrate would suit.

In one embodiment of the component-external-substrate assembly, the external substrate comprises a metal electrode, which is connected with the projecting electrode of the semiconductor device. While it is in general easier to provide the gap on the substrate, and not on the external substrate, it is well possible to additionally provide a corresponding stress-complying structure at the interface between the projecting electrode and the external substrate.

According to a third aspect of the invention, a method is provided for making a semiconductor component on a substrate. The method comprises the steps:

fabricating a projecting electrode on the substrate for electrically connecting the semiconductor component to an external substrate, fabricating a gap, which allows a stress-compensating deformation of the projecting electrode relative to the substrate, between the substrate and a substrate face of the projecting electrode in a first substrate-face section of the projecting electrode, electrically connecting and mechanically fixing the projecting electrode to the substrate in a second substrate-face section.

In the method of the invention, the step of fabricating a gap is performed after or concurrently with the step of fabricating the projecting electrode. This includes the possibility that the gap is fabricated in a number of processing steps, some of which are performed concurrently with the step of fabricating the projecting electrode, and some of which are performed after the step of fabricating the projecting electrode. Concurrent fabrication of the gap and the electrode means that the gap is fabricated while the fabrication of the projecting electrode has not been finished.

Furthermore, the step of electrically connecting and mechanically fixing the second substrate-face section of the projecting electrode is performed before or concurrently with the step of fabricating the gap. This includes the possibility that the gap is fabricated in a number of processing steps, some of which are performed concurrently with the step of electrically connecting and mechanically fixing the projecting electrode to the internal substrate, and some of which are performed after that step.

The method of the invention provides a process for fabricating the semiconductor device of the invention.

A further aspect of the invention is a method for forming a component-external-substrate assembly, which comprises the steps:

providing a semiconductor component according to claim 1 providing an external substrate connecting the semiconductor component and the external substrate via the projecting electrode.

In the following, preferred embodiments of the two methods of the invention will be described. It is understood that embodiments of the method of the third aspect for making a semiconductor component also form embodiments of the method of the fourth aspect for forming a component-external-substrate assembly. Furthermore, the embodiments can be combined with each other unless explicitly described as alternative embodiments.

In one preferred embodiment, the step of fabricating the gap comprises:

before the step of fabricating the projecting electrode structure: fabricating a recess structure, which is associated with the substrate, and after the step of fabricating the projecting electrode structure: removing a layer between the recess structure and the substrate-face of the projecting electrode in its first substrate-face section.

In this embodiment, the projecting electrode has additional use as a mask for a removal of the adhesion layer outside the first and second substrate-face regions. The layer that is partly removed between the recess structure and the substrate face of the projecting electrode is in one embodiment the adhesion layer that was mentioned before in the context of other embodiments of the semiconductor component of the invention.

Preferably, removing the layer from between the recess structure and the substrate-face of the projecting electrode in its first substrate-face section comprises exposing the layer to an etchant. A liquid etchant is preferred. In order to promote the distribution of the liquid etchant in the second substrate-face section, fabricating the recess structure preferably comprises fabricating slits in the recess structure, which slits have a lateral width that promotes the distribution of the liquid etchant by capillary effects.

Another aspect of the invention is a method for forming a component-substrate assembly, comprising the steps:

providing a semiconductor component according to the first aspect of the invention;

providing an external substrate;

connecting the semiconductor component and the external substrate via the projecting electrode.

The step of providing the semiconductor component according to the first aspect of the invention preferably comprises performing the method according to the third aspect of the invention or one of its embodiments.

Preferred embodiments of the invention are also defined in the claims. It shall be understood that the semiconductor component and the assembly, as well as the methods for forming the semiconductor component and the component-external-substrate assembly have similar and/or identical embodiments.

BRIEF DESCRIPTION OF THE DRAWINGS

The invention will now be explained in more detail with reference to the drawings in which FIGS. 1 and 2 show schematic cross-sectional views of an embodiment of a semiconductor component.

FIGS. 3 and 4 show different schematic cross-sectional views of a component-external-substrate assembly that comprises the semiconductor component of FIGS. 1 and 2.

DETAILED DESCRIPTION OF EMBODIMENTS

Figure 5:
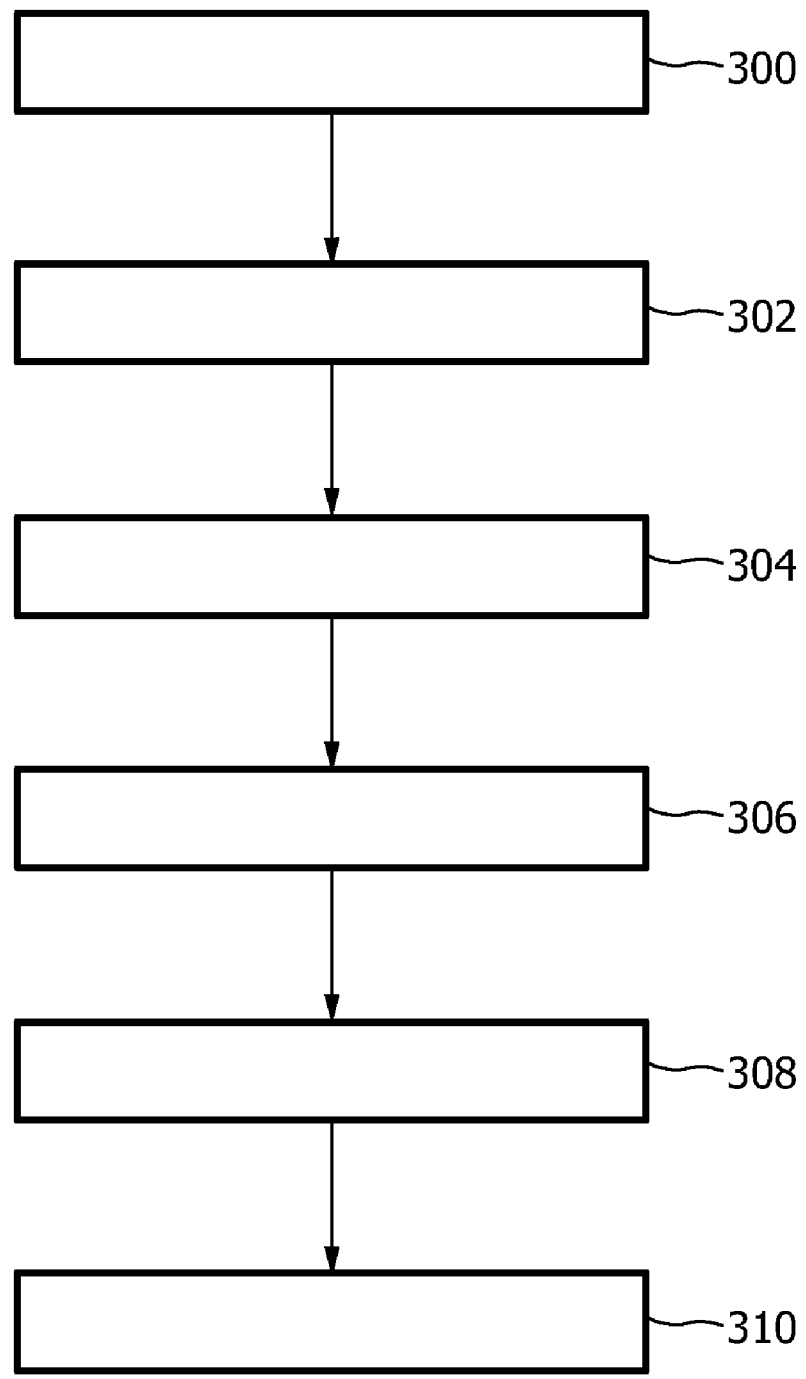
FIG. 5 shows a flow diagram of a method for fabricating a semiconductor component on a substrate.

FIGS. 1 and 2 show schematic cross-sectional views of an embodiment of a semiconductor component. The two cross-sectional views of FIGS. 1 and 2 show sectionals planes, which are perpendicular to each other. The sectional plane shown in FIG. 1 is indicated by a dashed line I-I in FIG. 2. In the following, reference is made to FIGS. 1 and 2 in parallel.

The semiconductor component 100 has a substrate 102 and a projecting electrode in the form of a bump 104 on the substrate 102. The substrate 102 contains integrated circuits (not shown), and is covered by a layer stack 106, which contains an isolation layer 108, a metallization layer 110, and a passivation layer 112. The passivation layer 112 is made of silicon dioxide or silicon oxynitride or silicon nitride or a combination of these, for instance in the form of a layer structure, such as a sandwich layer structure. Organic materials are also possible, e.g., polyimide. The metallization layer is made of Al with a content of Cu or Si, or made of Cu. The bump 104 is in the present embodiment made of Au. Alternative possible materials are Al, Cu, or a combination of Au and Cu. Generally, any material can be used for the bump that is electrically conductive and can be fixed by soldering, gluing, or another known technique, to an external substrate, such as a circuit board, for providing a mechanical and electrical connection.

The metallization layer 110 and the passivation layer 112 on top of it contain a recess structure 114. The recess structure comprises a number of openings in the metallization layer 110, of which, by way of example, openings 116 to 126 are shown in the present schematic view. The openings 116 to 126 create a regularly spaced grid of metallization lines. The metallization lines have a lateral width w and a lateral pitch p, which is chosen to allow a formation of slits, such as slit 128 in the opening 120 during a conformal deposition of the passivation layer 112. The lateral width of the slits is suitable for forming channels promoting a distribution of a liquid etchant by capillary effects. This way, the recess structure 114 enables the formation of a gap between the layer stack 106 on the substrate 102 and the bump 104 during manufacture, as will be explained in more detail in the context of the description of FIG. 5. The recess structure also defines the profile of the gap between the bump 104 and the passivation layer 112 on the substrate side. Obviously, different surface portions of the passivation layer 112 are arranged at different distances from the bottom face of the projecting electrode in its first substrate-face section 132.

The bump 104 has a substrate face 130, which faces the substrate 102. The substrate face 130 has a first substrate-face section 132, which extends above the recess structure 114. The first substrate-face section is substantially flat. A second substrate-face section 134 extends outside the lateral region of the recess structure 114 and contacts an adhesion layer 136. The adhesion layer 136 is electrically conductive. An opening 138 in the passivation layer 112 is filled with the adhesion layer 136 and a protruding bump section 140, which extends into the opening 138.

Thus, the bump 104 is mechanically and electrically connected to the metallization layer 110 via adhesion layer 136. However, the mechanical contact between the bump 104 and the substrate is limited to the second substrate-face section 134. The bump 104 is separated from the substrate in the first substrate-face section 130 by the gap between the recess structure 114 and the first substrate-face section 132. This structure keeps the electrical contact unaffected, but reduces the footprint of mechanical contact between the substrate and the bump. The mechanical contact is reduced to an extent, which secures a required minimum adhesion of the bump to the component.

The reduced footprint of mechanical connection between the bump 104 and the underlying substrate reduces the mechanical stress exerted between the two, for instance in a situation when the semiconductor component is exposed to heating or cooling. Since the component and the bump are typically have different material compositions, the mechanical adaptation to changing temperatures differs between the two, according to their respective coefficients of thermal expansion. If mechanical stress is generated, be it by thermal effects or by mechanical impact, the bump 104 has the ability to comply in three dimensions without exerting stress to the underlying substrate, including the layer stack 106.

This way, a delamination of layers of the layer structure 106 or a breakout of material from the substrate 102 can be avoided.

FIGS. 3 and 4 show different schematic cross-sectional views of a component-external-substrate assembly that comprises the semiconductor component of FIGS. 1 and 2. Specifically, the component-external-substrate assembly 200 of FIGS. 3 and 4 comprises the semiconductor component 100 of FIGS. 1 and 2. In addition, the component-external-substrate assembly 200 comprises an external substrate in the form of a circuit board 202 with a metal electrode 204, which is connected to the bump 104, for instance by soldering.

The component-external-substrate assembly 200 has the advantage of better compliance to mechanical stress, for instance during thermal cycling or in response to mechanical impacts. The amount of mechanical stress exerted between the substrate 202, the bump 104, and the substrate 102 of the semiconductor component 100 and its layer structure on top is reduced in such situations.

Typically, the circuit board 202 is made of an organic material, which normally has a higher coefficient of thermal expansion than the different layers of the semiconductor component 100. In prior-art devices, such mechanical stress can result in a delamination of films on the circuit board. This problem is avoided in the component-external-substrate assembly 200, which allows the bump 104 to comply in three dimensions to mechanical stress. This results in an improved live-time of the assembly.

The semiconductor component can be based on silicon or other substrate materials such as gallium arsenide (GaAs), silicon germanium (SiGe), or other substrate materials. The component and assembly structures of FIGS. 1 through 4 may also form an optical or electro-optical assembly, a mechanical assembly, a MEMS or a combination of the above. Likewise, any other assembly that makes use of a ridged-bump-type structure can form a semiconductor component 100 or a component-external-substrate assembly 200.

FIG. 5 shows a flow diagram of a method for fabricating a semiconductor component on a substrate. The present embodiment of the method of the invention relates to the fabrication of the semiconductor component 100 and of the component-external-substrate assembly 200 of FIGS. 1 to 4.

In a first step 300, the semiconductor component 100 is fabricated up to the deposition of the metallization layer 110.

Subsequently, in a step 302, the metallization layer is laterally structured by a suitable patterning technique such as photolithography to form the openings 116 to 126 in the metallization layer 110. In a following processing step 304, the passivation layer 112 is deposited, preferably using a conformal deposition technique. This way, small slits such as slit 128 are created, which form capillary channels that promote the propagation of an etchant during later processing.

Then, the adhesion layer 136 is deposited on top of the passivation layer 112 (step 306). A conformal deposition technique is used to form the adhesion layer. At this point, the adhesion layer covers the complete substrate surface.

Using techniques known per se, the bump 104 is then fabricated on top of the passivation layer 112 and the adhesion layer 136 (step 308). In one embodiment, this involves a masked deposition of metal.

In a next processing step, the adhesion layer 136 is removed from all portions of the substrate, which are not covered by the bump 104. Furthermore, the recess structure 114 is used to fabricate a gap between the passivation layer and the substrate face 130 of the bump 104 (step 310) underneath the first substrate-face section 132. The gap is formed, once a liquid etchant has penetrated and etched the adhesion layer 136. This is supported by distributing the etchant through the channels formed in the recess structure. The channels provided in the recess structure thus serve to create the gap. This way, the adhesion layer 136 is removed underneath the first substrate-face section 132.

In the following, the processing up to this point is summarized:
Step 300: Fabricate semiconductor component structure up to metallization layer.
Step 302: Fabricate recess structure.
Step 304: Deposit passivation layer.
Step 306: Deposit adhesion layer.
Step 308: Fabricate projecting electrode.
Step 310: Remove adhesion layer from underneath first substrate-face section of projecting electrode.

For fabricating an assembly such as assembly 200, the semiconductor component 100 is brought in contact with the circuit board 202 at the metal electrode 204. Subsequently, known techniques are used to attach the bump 104 to the metal electrode 204.

While the invention has been illustrated and described in detail in the drawings and foregoing description, such illustration and description are to be considered illustrative or exemplary and not restrictive; the invention is not limited to the disclosed embodiments.

Applications of the invention include, without restriction, components and assemblies in the fields of electronics, optoelectronics, MEMS, biomedical technologies, and sensors.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

Any reference signs in the claims should not be construed as limiting the scope.

The invention claimed is:

1. A semiconductor component having a substrate and a projecting electrode on the substrate for electrically connecting the semiconductor component to an external substrate,
wherein the projecting electrode has a substrate face, which faces the substrate and which comprises a first substrate-face section separated from the substrate by a gap that allows a stress-compensating deformation of the projecting electrode relative to the substrate, and which comprises a second substrate-face section, which is in fixed mechanical connection and in electrical connection with the substrate, and
wherein the gap comprises a recess structure associated with the substrate, the recess structure comprising different surface portions arranged at different distances from the bottom face of the projecting electrode in its first substrate-face section;
wherein the recess structure comprises a plurality of slits, which promote the distribution of a liquid etchant by capillary effects.

2. The semiconductor component of claim 1, wherein the gap is filled with a gaseous medium.

3. The semiconductor component of claim 1, wherein the substrate face the projecting electrode is flat.

4. The semiconductor component of claim 1, wherein the recess structure is formed in a layer stack, which is arranged on the substrate.

5. The semiconductor component of claim 4, wherein the layer stack comprises, in a direction from the substrate to the projecting electrode, a metallization layer and a passivation layer, and wherein the projecting electrode, in its second substrate section, is connected with the metallization layer.

6. The semiconductor component of claim 5, wherein the projecting electrode, in its second substrate-face section, is fixed to the metallization layer by an electrically conductive adhesion layer.

7. A component-external-substrate assembly, comprising the semiconductor component of claim 1, which is connected to an external substrate through the projecting electrode.

8. A method for fabricating a semiconductor component on a substrate, comprising the steps:

fabricating a projecting electrode on the substrate for electrically connecting the semiconductor component to an external substrate;

fabricating a gap, which allows a stress-compensating deformation of the projecting electrode relative to the substrate, between the substrate and a substrate face of the projecting electrode in a first substrate-face section of the projecting electrode;

electrically connecting and mechanically fixing the projecting electrode in a second substrate-face section to the substrate;

wherein the step of fabricating a gap is performed after or concurrently with the step of fabricating the projecting electrode; and wherein the step of electrically connecting and mechanically fixing the second substrate-face section of the projecting electrode is performed before or concurrently with the step of fabricating the gap;

wherein the step of fabricating the gap comprises before the step of fabricating the projecting electrode structure; fabricating a recess structure, which is associated with the substrate, the recess structure comprising different surface portions arranged at different distances from the bottom face of the projecting electrode in its first substrate-face section; and after the step of fabricating the projecting electrode structure; removing a layer between the recess structure and the substrate-face of the projecting electrode in its first substrate-face section;

wherein removing the layer comprises exposing the layer to an etchant, and wherein fabricating the recess structure comprises fabricating slits in the recess structure, which have a lateral width that promotes the distribution of a liquid etchant by capillary effects.

9. A method for forming a component-substrate assembly comprising the steps:

providing a semiconductor component according to claim 1;

providing an external substrate; and connecting the semiconductor component and the external substrate via the projecting electrode.

* * * * *